United States Patent
Dehmel et al.

(10) Patent No.: US 9,013,199 B2
(45) Date of Patent: *Apr. 21, 2015

(54) CONTACT-CONNECTION UNIT FOR A TEST APPARATUS FOR TESTING PRINTED CIRCUIT BOARDS

(75) Inventors: Rüdiger Dehmel, Wunstorf (DE); Andreas Gülzow, Springe (DE)

(73) Assignee: DTG International GmbH, Zurich (CH)

( * ) Notice: Subject to any disclaimer, the term of this patent is extended or adjusted under 35 U.S.C. 154(b) by 678 days.

This patent is subject to a terminal disclaimer.

(21) Appl. No.: 13/262,625

(22) PCT Filed: Apr. 1, 2010

(86) PCT No.: PCT/EP2010/054410
§ 371 (c)(1),
(2), (4) Date: Sep. 30, 2011

(87) PCT Pub. No.: WO2010/112584
PCT Pub. Date: Oct. 7, 2010

(65) Prior Publication Data
US 2012/0019275 A1    Jan. 26, 2012

(30) Foreign Application Priority Data
Apr. 3, 2009   (DE) .......................... 10 2009 016 181
Apr. 1, 2010   (WO) ................. PCT/EP2010/054410

(51) Int. Cl.
*G01R 31/20*   (2006.01)
*G01R 1/073*   (2006.01)
(52) U.S. Cl.
CPC ........ *G01R 1/07328* (2013.01); *G01R 1/07378* (2013.01)
(58) Field of Classification Search
None
See application file for complete search history.

(56) References Cited

U.S. PATENT DOCUMENTS 4,707,655 A  *  11/1987  Kruger ..................... 324/755.01
4,721,908 A        1/1988  Driller et al.
(Continued)

FOREIGN PATENT DOCUMENTS

CN    1461412 A    12/2003
DE   85 348 41 U1    4/1986
(Continued)

OTHER PUBLICATIONS

International Search Report and Written Opinion for International Application No. PCT/EP2010/054410; dated Jul. 27, 2010; 16 pages.
(Continued)

*Primary Examiner* — Paresh Patel
(74) *Attorney, Agent, or Firm* — Christie, Parker & Hale, LLP

(57) ABSTRACT

The invention relates to a contacting unit for a test apparatus for testing printed circuit boards. The contacting unit comprises a full grid cassette and an adapter. The full grid cassette is provided with a plurality of spring contact pins arranged in the grid of contact points of a basic grid of a test apparatus. The adapter is provided with test needles for electrically connecting each of the spring contact pins of the full grid cassette to a circuit board test point of a printed circuit board to be tested, the spring contact pins being secured in the full grid cassette against falling out on the side remote from the adapter and the test needles being secured in the adapter on the side remote from the full grid cassette. The adapter and the full grid cassette are releasably joined to each other. In this way, both the spring contact pins and the test needles are secured against falling out of the contacting unit in the assembled state of the adapter and the full grid cassette.

24 Claims, 8 Drawing Sheets

(56) References Cited

U.S. PATENT DOCUMENTS

| | | | |
|---|---|---|---|
| 4,834,659 A | 5/1989 | Mang et al. | |
| 4,866,375 A * | 9/1989 | Malloy | 324/750.19 |
| 4,926,119 A | 5/1990 | Prokopp | |
| 4,935,696 A | 6/1990 | DiPerma | |
| 4,952,872 A | 8/1990 | Driller et al. | |
| 5,307,560 A | 5/1994 | Aksu | |
| 5,311,120 A * | 5/1994 | Bartholomew | 324/750.19 |
| 5,357,671 A * | 10/1994 | Gladik et al. | 29/739 |
| 5,450,017 A * | 9/1995 | Swart | 324/754.08 |
| 5,493,230 A | 2/1996 | Swart et al. | |
| 5,511,304 A * | 4/1996 | Aksu | 29/705 |
| 6,066,957 A | 5/2000 | Van Loan et al. | |
| 6,340,893 B1 | 1/2002 | Prokopp | |
| 6,646,457 B2 | 11/2003 | Ott et al. | |
| 7,893,705 B2 | 2/2011 | Guelzow et al. | |
| 2002/0158644 A1 | 10/2002 | Ott et al. | |
| 2003/0016037 A1 | 1/2003 | Kazama | |
| 2006/0261831 A1 | 11/2006 | Chou et al. | |
| 2009/0251161 A1 | 10/2009 | Guelzow et al. | |
| 2010/0283498 A1 | 11/2010 | Gülzow et al. | |

FOREIGN PATENT DOCUMENTS

| | | |
|---|---|---|
| DE | 3630548 A1 | 3/1988 |
| DE | 3812654 A1 | 11/1988 |
| DE | 3906691 A1 | 9/1989 |
| DE | 19644725 C1 | 4/1998 |
| DE | 19900833 A1 | 10/1999 |
| DE | 10 2006 059 429 A1 | 6/2008 |
| DE | 10 2007 047 269 A1 | 4/2009 |
| EP | 0 149 776 B1 | 7/1985 |
| EP | 0 315 707 A1 | 5/1989 |
| EP | 1 206 704 | 5/2002 |
| EP | 1 322 967 B1 | 7/2003 |
| FR | 2 887 034 | 12/2006 |
| JP | 62-225961 | 10/1987 |
| JP | 63-70174 | 3/1988 |
| JP | 06-18598 | 1/1994 |
| JP | 2007-322136 | 12/2007 |
| TW | 200839268 A | 10/2008 |
| WO | WO 01/14893 A1 | 3/2001 |
| WO | WO 02/31516 A1 | 4/2002 |
| WO | WO 2009/047160 A2 | 4/2009 |

OTHER PUBLICATIONS

Office action issued Dec. 1, 2009 by the German Patent Office for corresponding German Patent Application No. 10 2009 016181.3-35; 3 pages.

International Preliminary Report on Patentability for International Application No. PCT/EP2010/054410, Nov. 1, 2011, 10 pages.

Second Office action for Chinese Patent Application No. 201080015767.1, issued Dec. 25, 2013, 6 pages (English translation).

Third Office action for Chinese Patent Application No. 201080015767.1, issued Apr. 15, 2014, 8 pages (English translation).

Office action for Japanese Patent Application No. 2012-502691, dated Aug. 13, 2013, 3 pages (English translation).

Taiwanese Office action for Patent Appliation No. 099110193, dated Jan. 2, 2014, 5 pages (English translation).

* cited by examiner

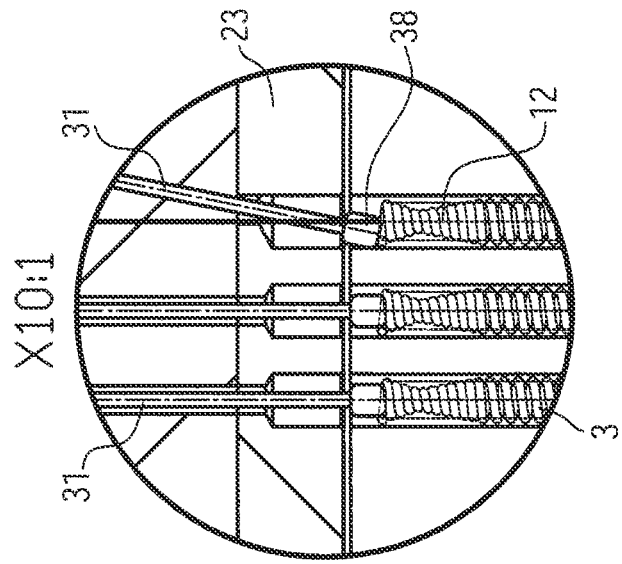
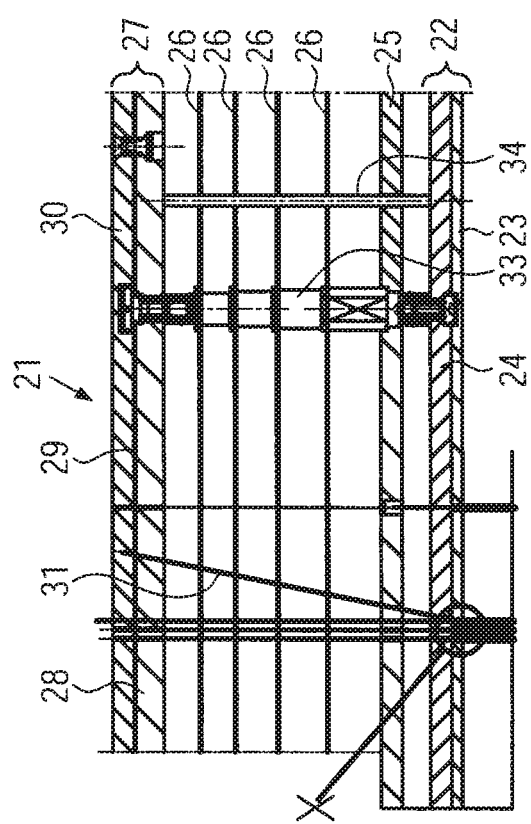
FIG. 3
FIG. 1

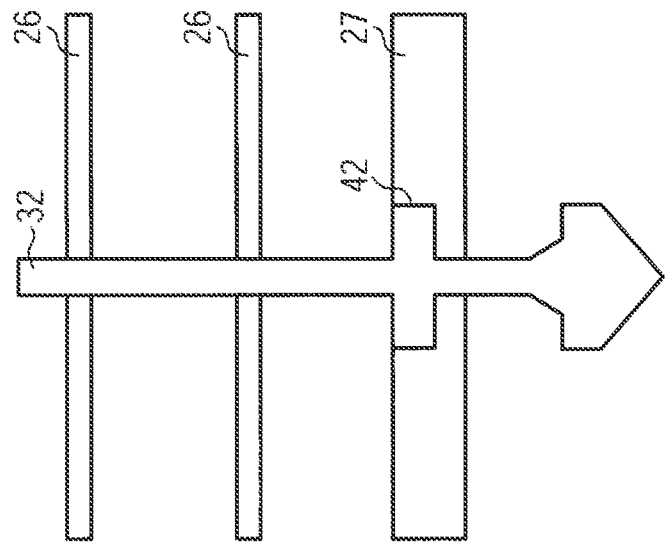
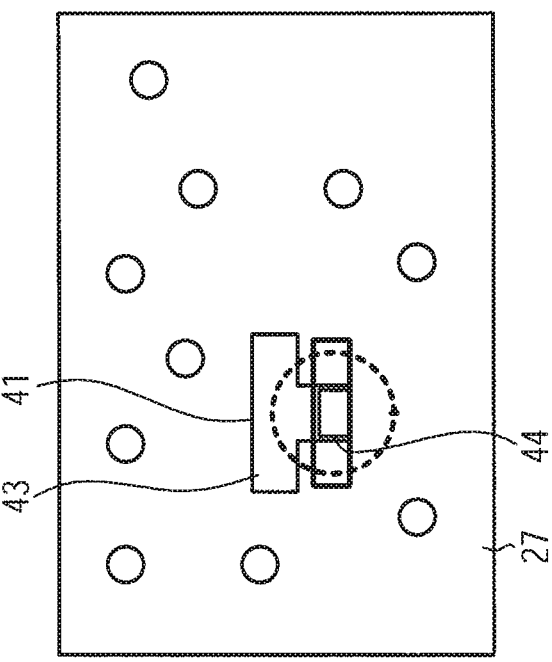

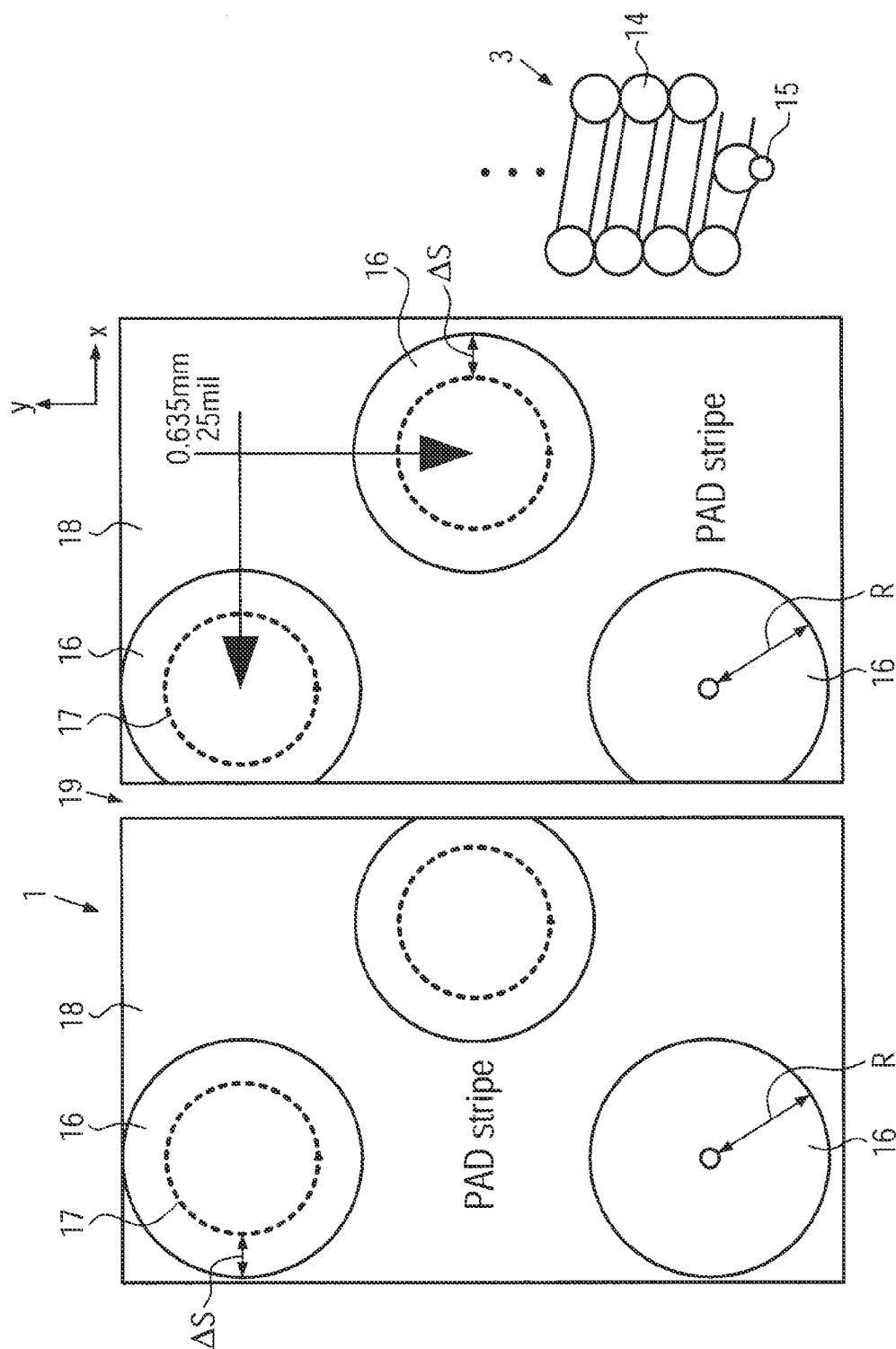

CONTACT-CONNECTION UNIT FOR A TEST APPARATUS FOR TESTING PRINTED CIRCUIT BOARDS

CROSS-REFERENCE TO RELATED APPLICATION

This application is a National Phase Patent Application and claims the priority of International Application Number PCT/IEP2010/054410, filed on Apr. 1, 2010, which claims priority of German Patent Application Number 10 2009 016 181.3, filed on Apr. 3, 2009.

The invention relates to a contacting unit comprising a full grid cassette and an adapter for a parallel tester for testing a non-componented printed circuit board.

Apparatus for testing printed circuit boards is divided into two groups, these being finger testers, which serially scan test points of a printed circuit board to be tested using a plurality of contact fingers, and parallel testers, which simultaneously contact all test points of a printed circuit board to be tested by means of an adapter. Such adapters are also known as grid pattern adapters, because they convert a preset regular basic grid of the test apparatus to the usually irregular arrangement of the test points of a printed circuit board to be tested. An adapter of this type as a rule comprises a plurality of spaced guide plates with guide holes designed to accommodate test needles. The test needles may inclined in the adapter, enabling them to establish an electrical connection between the contact points of the regular basic grid and the printed circuit board test points, which as a rule deviate from the regular arrangement of the basic grid.

As a rule, the adapter is not located directly on the basic grid, but a so-called full grid cassette is provided between the basic grid and the adapter. Similar to the adapter, a full grid cassette comprises a plurality of guide plates wherein contact pins matching the pattern of the basic grid are provided. These contact pins are designed as spring contact pins. The reason for using a full grid cassette of this type lies in the fact that such spring contact pins can be installed into the adapter mapping the pattern of the basic grid onto the test points of the printed circuit board to be tested, being too thick to be inclined in the adapter. On the other hand, it is necessary to compensate for variations in height caused by surface irregularities in the printed circuit board to be tested and/or by the inclination of the needles in the adapter by means of the spring contact pins of the full grid cassette.

A full grid cassette of this type may be an integral part of the test apparatus. It may, however, alternatively be designed as a separate component which can be exchangeably located on the basic grid of the test apparatus.

A special adapter has to be produced for each printed circuit board type to be tested. The full grid cassette, on the other hand, is independent of the type of the printed circuit board to be tested.

So-called plain needles can be used in the adapter. These are thin, straight sections of wire with a thickness of 0.1 mm to 0.2 mm. As nearly all testers are nowadays designed for testing both sides of a printed circuit board, the test apparatus requires the provision of adapters both below and above the printed circuit board to be tested. If the needles are not to fall out of the adapter, they have to be secured therein. If using such plain needles, they are secured either by means of a perforated latex film or by means of a nylon fabric. The latex film has to be pre-perforated at the points where the needles pass through it. The perforation of this type of film is very expensive and difficult. Using a fabric is significantly simpler, as the needles can penetrate the fabric between individual threads. This however results in an offset of the needles which can cause major problems as the density of the printed circuit board test points and thus of the needles increases.

From EP 149 776 B1, test needles for an adapter are known which have a spherical head at one end to prevent the sliding of the test needles into the adapter. The adapter described in this publication is however only suitable for apparatus for the single-face testing of printed circuit boards, because the test needles with their spherical heads always have to be on the top side of the adapter and the adapter cannot be turned upside down. This type of test needle was developed further by providing it with a spherical plastic head at a slight distance from the upper end of the needle. As a result, a further perforated plate could be placed on the adapter, thus securing the plastic heads of the needles between this perforated plate and a further guide plate. The needles secured in this way can no longer fall out of the adapter. These plastic heads and the additional retaining plate, however, require a minimum distance between adjacent needles, so that this securing method does not allow for any further increase in the density of the needle arrangement.

German Patent Application DE 10 2006 059 429 A1 describes a parallel tester for testing non-componented printed circuit boards, the basic grid of which is made up from two interlaced square grids. Each square grid has a grid spacing of 50 mil. The two grids are offset relative to one another in the X-and Y-directions by half a grid spacing (=25 mil) (FIG. 2b). Such a grid can be illustrated as a square grid placed at an angle of 45°, the grid spacing of this inclined square grid being approximately 0.89 mm. The density of the contact points of the basic grid as a whole is 124 contact points per square centimeter. As the test points of the printed circuit boards to be tested are arranged in an irregular pattern, there are regions where the density is increased significantly. In an area of e.g. 1 cm×1 cm, this density may reach more than 600 printed circuit board test points.

A very tight spacing of adjacent test needles can be achieved locally with the known adapters. From EP 206 704 B1, test needles for an adapter which have a tapering contact tip at their free ends are known. With these needles, the distances between adjacent contact tips can be reduced to 0.25 mm or less. However, as a result of the securing methods described above (latex film, fabric, plastic heads), it is impossible to arrange a plurality of such tightly spaced test needles in a preset area of e.g. 1 cm×1 cm. There is therefore a great need for a device for contacting a printed circuit board which would allow test needles to be arranged at a density of 600 test needles per $cm^2$ their ends facing the printed circuit board to be tested.

DE 196 44 725 C1 describes the basic structure of a full grid cassette. In this full grid cassette, full grid pins are installed, each of which comprises an upper and a lower pin section connected to one another by a coil spring in a resilient and electrically conductive manner. The spring has a larger diameter than the pin sections. The holes for the accommodation of the pin sections and the spring are stepped, holding the full grid pins captive in the full grid cassette.

DE 199 00 833 B4 describes a test holder for holding printed circuit boards in a test apparatus. The test holder comprises a support plate on which a probe plate is located. Holes for the accommodation of spring pressure probes are provided both in the support plate 12 and in the probe plate. Between the support plate and the probe plate, a probe retaining film is provided through which the spring pressure probes extend. The film may be made of close-celled rubber, in particular latex rubber.

FR 2 887 034 illustrates the use of a non-sheathed spring contact pin formed from a wire with a helically wound spring section. This spring contact pin is located between a substrate and a soldering point of a printed circuit board.

The examiner has cited this document with reference to the independent claim.

U.S. Pat. No. 4,884,024 discloses an apparatus for testing printed circuit boards. This apparatus comprises side walls, wherein a universal test pin support board is pivotally mounted on one of the said walls.

International Patent Application PCT/EP 2008/063038, which was published later, discloses a test apparatus for testing non-componented printed circuit boards which comprises a full grid cassette in which spring contact pins are located by means of a film. As a result, the full grid cassette can be handled with either side facing upwards without the spring contact pins falling out. This is particularly useful in combination with an adapter with test pins secured against falling out on one side only.

The invention is therefore based on the problem of creating a contacting unit for a parallel tester for testing a non-componented printed circuit board, which, compared to conventional devices, would allow locally for a higher contact point density and which would moreover be suitable for testing both sides of printed circuit boards.

This problem is solved by a contacting with the features of claim 1. Advantageous further developments of the invention are specified in the dependent claims.

The contacting unit according to the invention for a test apparatus for testing printed circuit boards comprises a full grid cassette and an adapter, wherein the full grid cassette has a plurality of spring contact pins located in the grid of contact points of a basic grid of the test apparatus and wherein the adapter has test needles provided for electrically connecting each one of the spring contact pins of the full grid cassette to one of the circuit board test points of the printed circuit board to be tested, wherein the spring contact pins in the full grid cassette are secured against falling out on the side remote from the adapter and the test needles in the adapter are secured against falling out on the side remote from the full grid cassette, the adapter and the full grid cassette being releasably connected to each other such that the adapter and the full grid cassette form a rigidly joined contacting unit.

As the full grid cassette and the adapter are releasably connected to one another, they form a handy contacting unit in their connected state in which the spring contact pins are secured against falling out of the full grid cassette by the adapter on the side oriented towards the adapter and the test needles are secured against falling out of the adapter towards the full grid cassette by the corresponding spring contact pins in the full grid cassette. This contacting unit can therefore be handled with either side facing upwards without risking the loss of one of the spring contact pins or test needles.

Neither the full grid cassette nor the adapter requires means for securing the spring contact pins or the test needles respectively on both sides of the full grid cassette or the adapter respectively against falling out. If the full grid cassette is separated from the adapter, the spring contact pins and the test needles can simply be installed without any mechanical resistance. There is no need for retaining plates which secure the spring contact pins and the test needles respectively against falling out on the side from which they have been installed into the full grid cassette or into the adapter respectively. Although such retaining plates are common in prior art, they significantly reduce the maximum density for arranging the spring contact pins and the test needles.

With the present invention, it is therefore possible to create in a simple way a contacting unit with which the desired high density of spring contact pins and test needles can be obtained.

In conventional parallel testers with a full grid cassette and an adapter, the full grid cassette and the adapter were held in the test apparatus independently from each other by means of clamping devices. The adapter was aligned on the full grid cassette by means of alignment pins and corresponding alignment holes. There is no mechanical connection between the adapter and the full grid cassette. The adapter can therefore be replaced without interfering with the full grid cassette. The present invention differs from this conventional test apparatus in that the adapter and the full grid cassette are permanently or rigidly joined to each other to form a contacting unit. The contacting unit is installed into the test apparatus as an assembly and is replaced as an assembly.

In the preferred embodiment of the present invention, this releasable connection between the adapter and the full grid cassette is provided by a swivel joint and a locking device. In the assembled state, the full grid cassette or the adapter can be locked by means of the locking device, therefore forming a rigid unit. In the folded-open state, the sides of the full grid cassette and the adapter where spring contact pins or test needles can be inserted are freely accessible. The replacement of damaged spring contact pins or test needles is therefore a simple operation.

Within the scope of the invention, releasable connecting means other than a swivel joint can be provided in combination with a locking device. It may also be expedient to provide several locking and/or latching devices between the adapter and the full grid cassette, allowing their releasable mutual attachment without using a swivel joint.

The spring contact pins are preferably located in the full grid cassette without sheathing. In this way, full grid cassettes with a high spring contact pin density can be obtained by relatively simple means. The full grid cassette may further be designed with play at right angles to the axial dimension of the spring contact pins.

The test needles of the adapter are preferably substantially straight without any helical winding and have a thickened section which secures the test needles against falling out towards the side of the adapter which faces the printed circuit board to be tested.

The invention is explained in greater detail below with reference to the drawings. Of the drawings:

FIG. 1 is a sectional view of a region of an adapter together with an adjoining section of a full grid cassette;

FIG. 3 shows a section of the contact region between contact needles of the adapter and spring contact pins of the full grid cassette;

FIG. 6a is a diagrammatic representation of a contact pin of the adapter with a locking projection and some guide plates of the adapter;

FIG. 6b is a diagrammatic section of a guide plate with a hole for the accommodation of the contact pin from FIG. 6a;

FIG. 7 is a diagrammatic representation of an end section of a spring contact pin with a central spring contact point; and FIG. 8 is a top view of a section of a basic grid constructed from modules.

Figure 2:
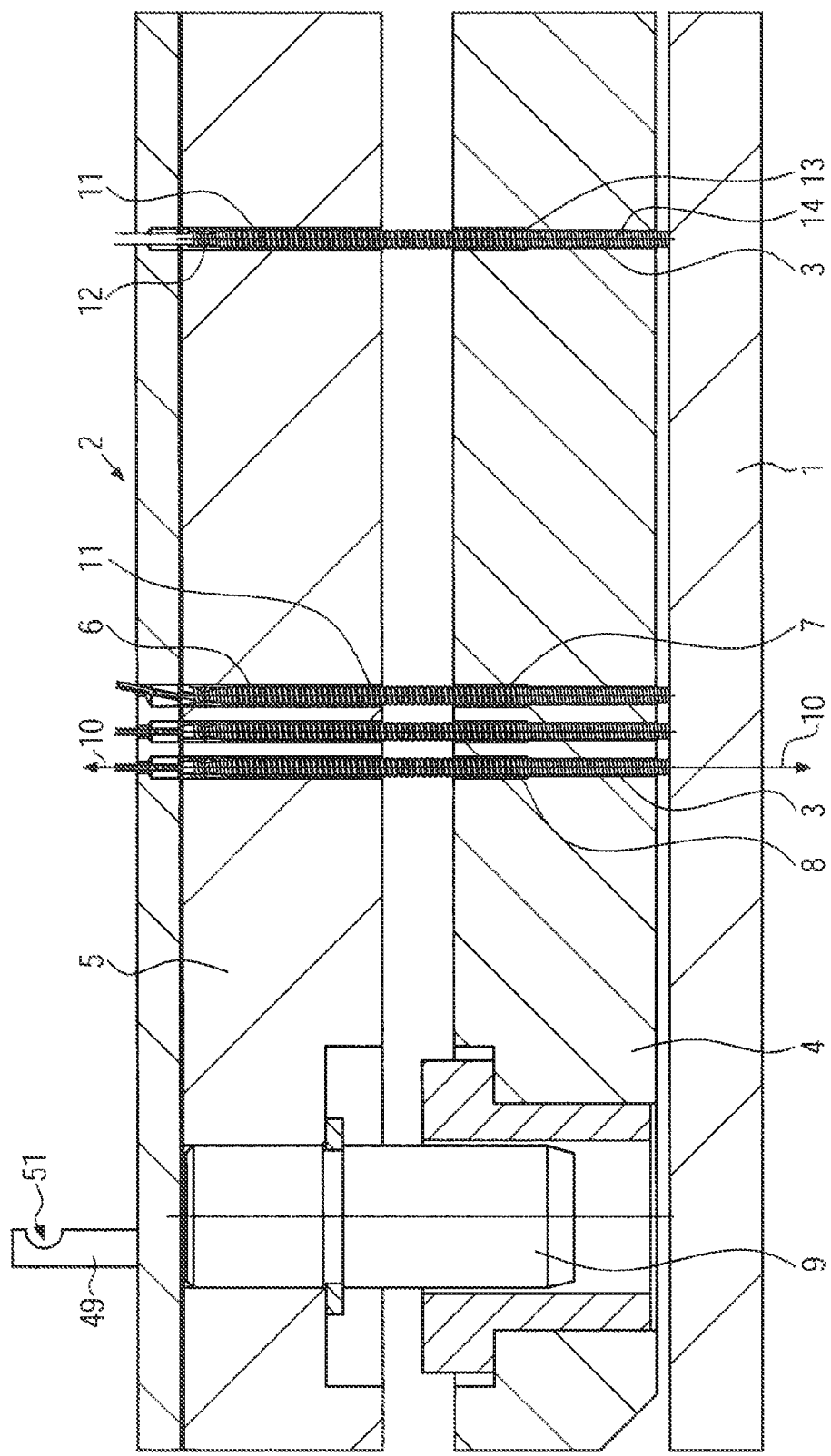
FIG. 2 is a sectional view of a region of the full grid cassette from FIG. 1 together with a section of the adapter.

A parallel tester comprises a plate-shaped basic grid element 1 (FIG. 2) with a plurality of contact points in the form of contact pads arranged in a regular grid pattern. Each of these contact points of the basic grid element 1 is connected to a port of an electronic evaluation unit. The basic grid element is as a rule made up from a plurality of strip-shaped segments.

The basic grid element 1 supports a full grid cassette 2 with spring contact pins 3. The spring contact pins 3 of the full grid cassette 2 are arranged in the same grid pattern as the contact points of the basic grid element 1, so that each contact point of the basic grid element 1 touches and electrically contacts a spring contact pin 3. The spring contact pins 3 are arranged parallel to one another.

In the present embodiment, the full grid cassette 2 comprises a basic grid plate 4 and an adapter plate 5. The plates 4, 5 have a thickness of 7 mm. Through holes 6 with a constant cross-section are provided in the adapter plate 5 for accommodating a spring contact pin 3 each. The diameter of the through holes 6 is approximately 0.75 mm.

The basic grid plate 4 is likewise provided with through holes 7. These through holes 7 have an annular step 8, the diameter of the through holes 7 corresponding to the diameter of the through holes 6 of the adapter plate 5 in the section between the annular step 8 and the side of the basic grid plate 4 which faces the adapter plate 5 while being somewhat less, for example 0.6 mm, in the section from the annular step 8 to the side of the basic grid plate 4 which faces the basic grid plate 1.

Several guide devices 9 are arranged in the edge region of the two plates 4, 5. Each of the guide devices 9 comprises two cylindrical sleeves which are displaceable relative to one another and wherein a coil spring (not illustrated) is located. The guide devices 9 are non-positively and/or positively joined to the plates 4, 5. The corresponding holes in the basic grid plate 4 and the adapter plate 5 are arranged such that they resiliently push apart the two plates 4, 5 to some degree. If no external pressure acts on the full grid cassette 2, a distance of approximately 2 to 5 mm is created between the two plates 4, 5 by the guide devices 9. In this way, the guide devices 9 guide the two plates 4, 5, if loaded, in such a way that they are substantially moved towards one another in the axial direction 10 of the spring contact pins 3 only.

The guide devices 9 are however disposed on the two plates 4, 5 and designed such that there is a play between the basic grid plate 4 and the adapter plate 5 at right angles to the axial direction 10. The spring contact pins 3 are wound from a wire with a thickness of e.g. 0.12 mm. They comprise a spring section 11 extending along most of the length of the spring contact pins 3. In the spring section 11, the spring contact pins 3 are helically wound with adjacent windings being arranged at a distance from one another, so that these spring sections provide a resilient spring action.

At the end facing the adapter, the spring section 11 merges into a so-called trumpet section 12. The trumpet section 12 comprises a few windings without axial spacing. As a result, the trumpet section 12 is rigid. It has a taper which widens again towards the end. This creates a depression facing the adapter. This depression accommodates the ends of contact needles or contact pins of the adapter. This taper gives the trumpet section the shape of a trumpet and thus its name. The applicant identifies such spring contact pins with a trumpet section as "trumpet springs".

At the end remote from the trumpet section 12, the spring section 11 merges into a thickened section 13 with a few windings with a diameter larger than that of all the other windings of the spring contact pin 3.

The thickened section 13 is adjoined by a plug-in section 14 of the spring contact pin 3. The individual windings of the plug-in section 14 have a smaller diameter than those of the spring section 11 and are not spaced, so that the plug-in section 14 is rigid. At the transition from the spring section 11 to the plug-in section 14, the spring contact pin 3 has a taper or step which abuts the annular step 8 of the through hole 7 and prevents the falling out of the spring contact pin 3 from the full grid cassette towards the basic grid plate 1. With regard to the direction facing away from the basic grid plate, the spring contact pin 3 is freely movable in the full grid cassette.

At the end of the plug-in section 14 which faces the basic grid plate 1, the spring contact pin 3 has a slight taper, the last winding section being bent to a smaller radius than the adjacent windings, so that the end of the wire of the spring contact pin 3 is approximately central relative to the adjacent windings. This creates a central spring contact point 15 (FIG. 2, FIG. 8).

FIG. 8 is a top view of a section of a basic grid with circular contact pads 16. This basic grid comprises two interlaced square grids. Each square grid has a grid spacing of 50 mil. The two grids are offset relative to one another in the X- and Y-directions by half a grid spacing (=25 mil).

The contact point of conventional spring contact pins lies outside the centre of the spring contact pin on a circular line indicated diagrammatically in FIG. 8 as circular line 17. If the spring contact pin is not centred accurately relative to the contact pad, there is a risk that the spring contact pin may contact the basic grid element outside the contact point, whereby an electrical contact would be prevented. With an eccentric placing of the contact point, faulty contacting may be caused even at an offset which is only equal to the distance between the circular line 17 and the outer edge of the contact pad 16 (=Δs).

With a central placing of the spring contact point 15 on the spring contact pin 3, the spring contact pin 3, if perfectly aligned, contacts a contact pad 16 precisely in the centre. The tolerance band from which there is a risk of faulty contacting therefore covers the full radius R of the contact pad 16, being a multiple of the tolerance band Δs achieved by the accurate placing of conventional spring contact pins.

This is particularly advantageous if the basic grid is constructed from several modules 18. There are abutting edges 19 between the modules. In the region of the abutting edges 19 of the modules, the contact pads 16 are slightly cut for reasons of manufacturing technology, so that the tolerance band for an offset of the spring contact pins relative to the contact pads 16 is reduced even more. In the region of the abutting edges 19, the risk of faulty contacting with an eccentric contact point is increased significantly.

The contact pads shown in FIG. 8 have a diameter D of 0.635 mm or a radius of 0.317 mm. The optimum obtainable tolerance is therefore 0.317 mm. In conventional spring pins, the circular line 17 has a diameter of 0.4 mm (r=0.2 mm). This results in a tolerance band of only 0.117 mm. If the contact pads 16 are cut at the abutting edges, this is reduced to 0.06 mm.

The basic grid plate 4 and the adapter plate 5 are made of a non-fibrous plastic material. This gives the through holes 6, 7 a smooth surface which facilitates the insertion of the spring contact pins. An example for a suitable plastic material is polyether ether ketone (PEEK). In the present embodiment, the plates 4, 5 have a thickness of 7 mm. A plate thickness of 5 to 10 mm is conceivable.

The electrical connection between the spring contact pins arranged in a regular grid pattern and the irregularly arranged contact points of a printed circuit board to be tested, which will hereinafter be referred to as printed circuit board test points, is established via an adapter 21. The adapter 21 is constructed from a plurality of guide plates arranged parallel to one another. Adjacent to the full grid cassette 2, a plate assembly with two plates is provided, which has holes matching the pattern of the spring contact pins of the full grid cassette or of the contact points of the basic grid respectively. This plate assembly will hereinafter be referred to as basic grid unit 22 or BG unit 22. The BG unit 22 comprises a cover plate 23 and a structural plate 24. The cover plate immediately adjoins the full grid cassette 2 and has a thickness of approximately 1.5 mm. The structural plate 24 is in contact with the cover plate 23. It has a thickness of 3 mm and provides the adapter with the necessary mechanical strength on the side facing the full grid cassette.

A retaining plate 25 is provided at a slight distance from the structural plate 24. The retaining plate has a thickness of 3 mm.

Four thin guide plates 26 are arranged at a distance from one another. Each has a thickness of 0.3 mm. On the side of the adapter 21 which faces the printed circuit board, an assembly of three plates is provided, which will hereinafter be referred to as printed circuit board unit or PCB unit 27. The PCB unit comprises a structural plate 28, a guide plate 29 and a cover plate 30. The structural plate 28 provides the PCB unit 27 with the necessary mechanical strength. This structural plate 28 has a thickness of 4 mm.

The cover plate 23 and the cover plate 30 are bolted to the other plates of the adapter outside the test area. These screw connections can therefore not affect the electrical properties of the adapter.

The guide plate 29 is once again a thin guide plate with a thickness of 0.3 mm. In such a thin plate, the holes for guiding the contact needles and contact pins can be produced more easily with a high precision than in the thicker structural and retaining plates. The guide plate 29 or the cover plate 30 respectively has a hole pattern which matches that of the printed circuit board test points and thereby ensures that the test needles of the adapter 21 are aligned accurately to the printed circuit board test points.

With the exception of the cover plates 23, 30, all plates are held at the required spacing by several known column mechanisms 33. Between the BG unit 22 and the PCB unit 27, alignment pins 34 are provided, each of which positively passes through a hole in the retaining plate 25 and in the guide plates 26, thereby precisely aligning the plates 25, 26.

The adapter 21 may be provided both with contact needles 31 and with contact pins 32 as test needles. The contact needles 31 are used for contacting pad arrays on the printed circuit board to be tested. The contact pins 32 are designed for contacting plated-through holes 37 of the printed circuit board 35.

Figure 5:
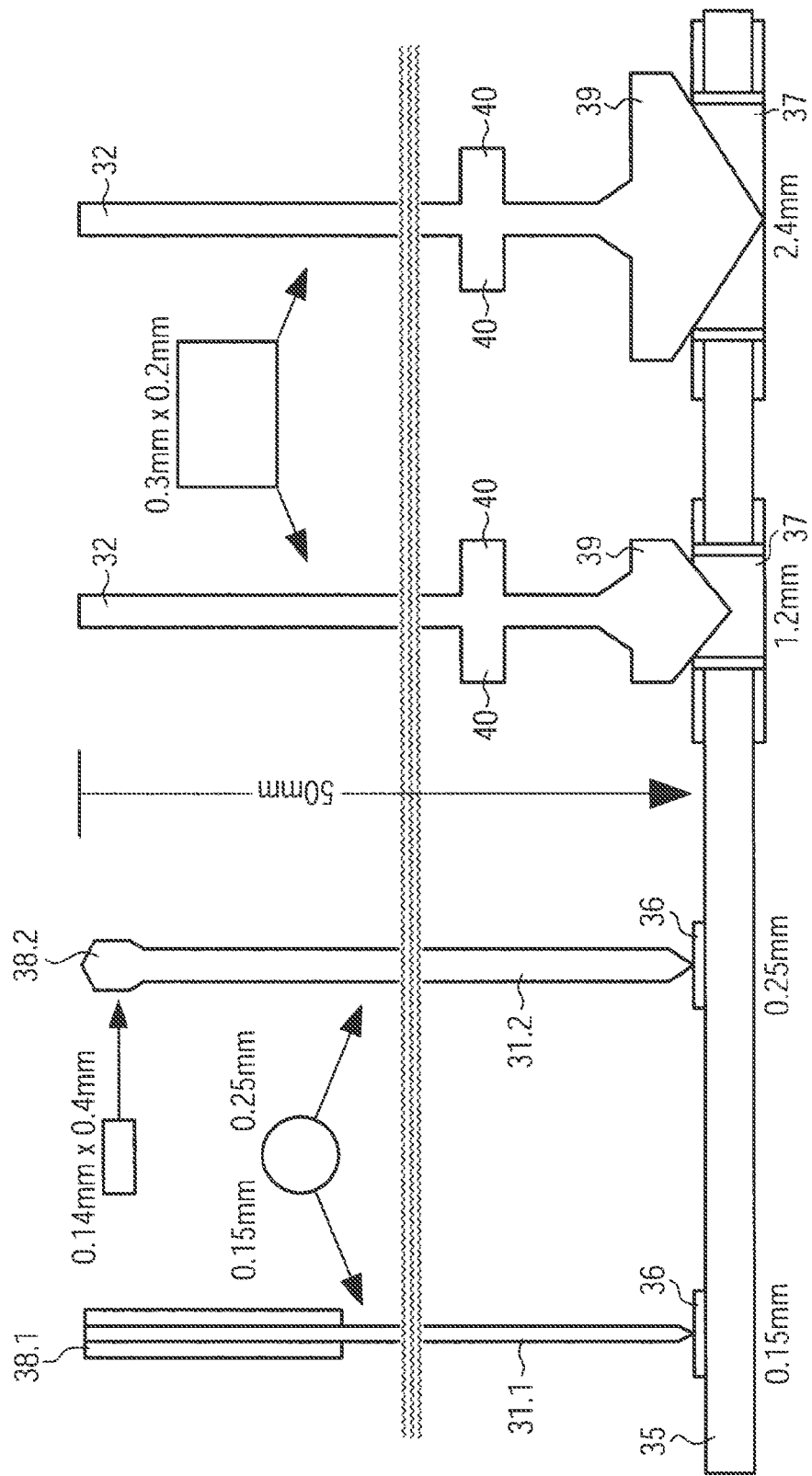
FIG. 5 is a diagrammatic representation of various contact needles and contact pins of the adapter together with a printed circuit board to be tested.

The contact needles 31 may have different diameters. In the present embodiment, contact needles 31.1 with a diameter of 0.15 mm and contact needles 31.2 with a diameter of 0.25 mm are provided (FIG. 5). Each of these contact needles 31 has a circular cross-section. At the ends facing the full grid cassette, they are provided with a thickening 38. This thickening 38 may be produced either by means of a snap-on or shrunk-on sleeve 38.1 or by means of a crimping 38.2 of the contact needle 31.2. Crimping is easier and more cost-effective. It requires a certain material thickness of the contact needle, however, and is mainly suitable for thicker contact needles. Thinner contact needles are better fitted with an additional sleeve 38.1.

Stepped holes are provided in the cover plate 23 to accommodate the crimping 38.2 of the contact needles 31.2, and stepped holes are provided in the retaining plate 25 to accommodate the sleeves 38.1 (FIG. 3). These stepped holes prevent the thickening 38 of the contact needles 31 from passing through the plate 23, 25, thus securing them against falling out towards the side of the printed circuit board to be tested. Towards the full grid cassette 2, the contact needles 31 are freely movable in the adapter 21.

In principle, such contact needles 31 are capable of contacting edge regions of the plated-through holes 37 on the surface of the printed circuit board 35. Experience shows, however, that the offsets of pad arrays 36 and plated-through holes 37 are independent of one another owing to the different production processes used. This means that, as a rule, all pad arrays 36 have a defined offset relative to their ideal position by a predetermined amount and in a predetermined direction, while all plated-through holes have a different offset in a predetermined direction and by a predetermined amount. The contact needles 31 have to be aligned and adjusted very precisely to the small pad arrays 36.

The contact pins 32, which are specifically designed for plated-through holes 37, have a widened scanning head 39 at the end facing the printed circuit board 35 (FIG. 5), A triangular point of this scanning head 39 points towards the printed circuit board 35. This permits the secure contacting of the plated-through hole 37 even if the contact pins 32 are not aligned so precisely to the plated-through holes 37 as the contact needles 31 are aligned to the pad arrays 36. In this way, all printed circuit board test points 36, 37 can be contacted securely even if the adapter 21 is mainly aligned to the printed circuit board 35 with reference to the contact needles 31 and the corresponding pad arrays 36.

The contact pins 32 according to the present embodiment are made of thin sheet metal with a thickness of e.g. 0.2 mm. The scanning heads are likewise made of this sheet metal.

Locking projections 40 are provided on the contact pins 32 at a slight distance adjacent to the scanning heads 39 (FIG. 5, 6a).

To accommodate the contact pins 32, special holes hereinafter referred to as keyholes 41 are provided in the PCB unit 27. These keyholes are large enough to allow the passage of the contact pin 32 together with its locking projection(s) 40. The keyhole 41 may be adjoined on the side of the PCB unit 27 which is remote from the printed circuit board by a recess 42 for the accommodation of the locking projection 40. In the embodiment shown in FIG. 61b, the keyhole 41 is T-shaped if viewed from above, so that the contact pin 32 together with its locking projection 40 can be guided through the "cross bar 43 of the T", whereupon it is displaced along the "upright 44 of the T" at the narrow section of the contact pin 32 in the region between the locking projection 40 and the scanning head 39. The recess 42 for the accommodation of the locking projection 40 adjoins the end of the upright 44 which is remote from the cross bar 43. The locking projection is installed into this recess 42, preventing the contact pin from moving back towards the cross bar 43 and from falling out of the adapter 21 on the side facing the printed circuit board.

The recess 40 is formed in the structural plate 28 of the PCB unit 27.

Within the scope of the invention, the keyhole 41 and the recess 42 may obviously have other shapes. The keyhole 41 may be designed as a slot, and the recess 42 may extend at right angles to the slot if viewed from above. In this case, the contact pin 32 will have to be rotated by 90° in the keyhole 41 following the insertion of the locking projection(s) 40, so that the locking projections 40 come to lie in the recess.

The keyhole 41 may alternatively be designed without a corresponding recess. The guide holes in the other guide plates 26 are arranged such that they guide the contact pin 32 through the keyhole 41 at a point which is so narrow that the locking projection(s) 40 come(s) to lie on the guide plate 27. In the T-shaped keyhole shown in FIG. 6b, this position, which is the ideal position of the contact pin 32, is located in the region of the upright 44. For insertion or removal, the contact pin 32 has to be bent to guide the locking projections 40 through the cross bar 43 of the T-shaped keyhole 41.

The contact pins 32 in the adapter 21 are oriented substantially perpendicular to the individual plates 23-30. The contact needles 31, on the other hand, are often inclined in the adapter 21. As a result, contact points of the printed circuit board to be tested which are not located in the grid can be contacted, and the ends of many contact needles 31 can be provided in locally limited regions on the side of the printed circuit board to be tested in order to obtain a high contact density. On the opposite side facing the full grid cassette 2, the ends of these contact needles are distributed over a much larger area in which they contact a plurality of spring contact pins 3. For this reason, it is desirable to incline the contact needles 31 as much as possible. In principle, there are no mechanical limits to the inclination of the contact needles 31. Any such inclination however shortens the contact needle 31 in the axial direction, this being the direction perpendicular to the plates 23-30. This length difference in the axial direction is compensated by the spring contact pins 3.

The full grid cassette 2 and the adapter 21 are mechanically joined to each other by means of a swivel joint 20. The swivel joint 20 is mounted at the edge of the adapter plate 5 of the full grid cassette 2 or at the edge of the BG unit 22 of the adapter 21 respectively. The swivel joint is preferably designed to be releasable. It may for example be released by a straight movement of the adapter or the full grid cassette towards the pivot axis. In this way, the full grid cassette 2 can easily be combined with another adapter 21.

At the edge of the adapter plate 5 of the full grid cassette 2 which is opposite the swivel joint 20 or at the edge of the BG unit 22 of the adapter 21, a locking device comprising at least one locking pin 49 and a pin location 50 is provided. In the present embodiment, the locking pin 49 is provided on the full grid cassette 2, while the pin location 50 is provided on the adapter 21. The locking pin 49 has a notch 51 for the releasable engagement of a latch (not illustrated) in the pin location 50 in order to locate the locking pin 49 in the pin location 50.

Figure 4A:
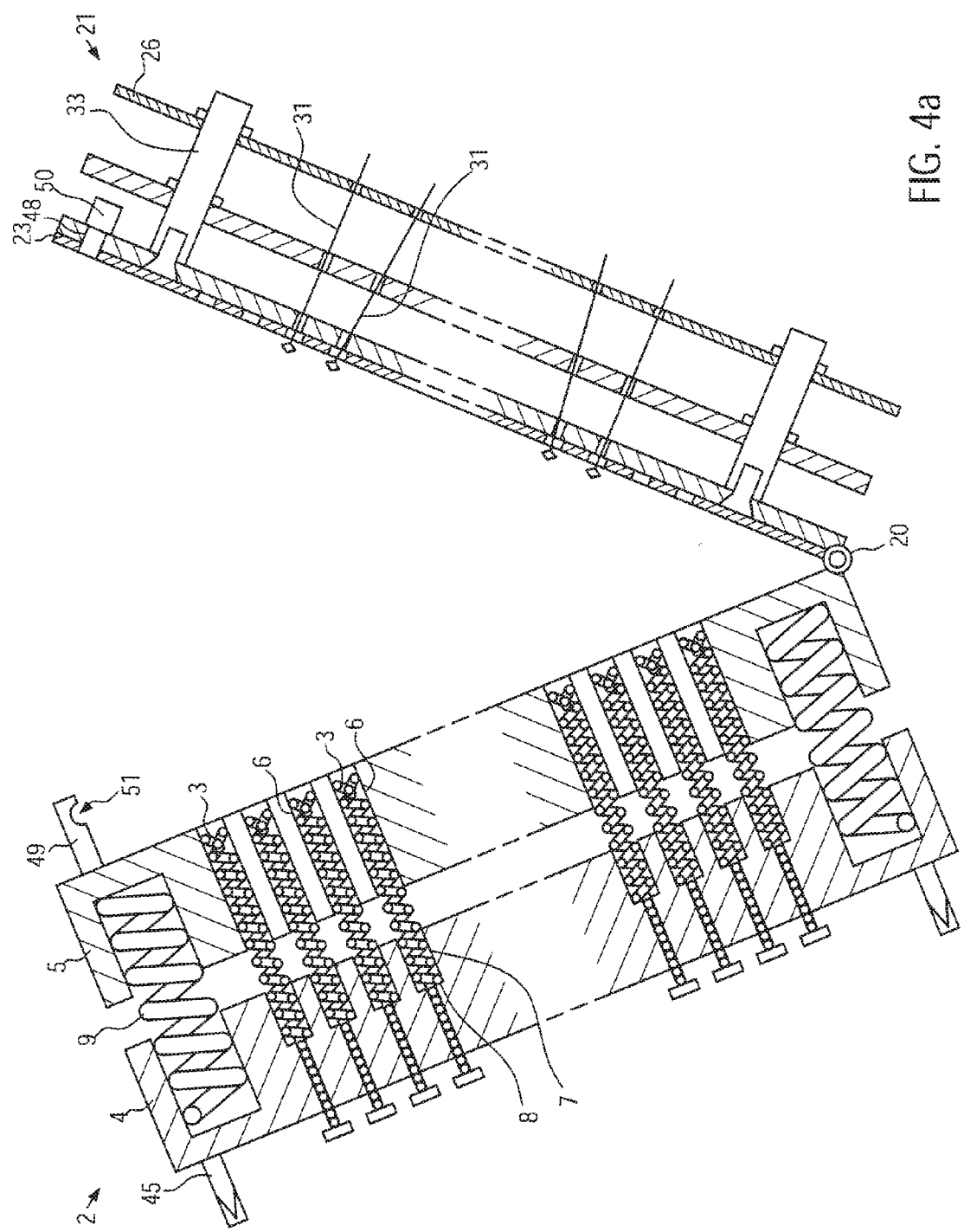
FIGS. 4a, 4b and 4c are diagrammatic sections through a contacting unit comprising a full grid cassette and an adapter in the folded-open state (FIG. 4a), in the folded, unloaded state (FIG. 4b) and in the folded, loaded state (FIG. 4c)
Figure 4B:
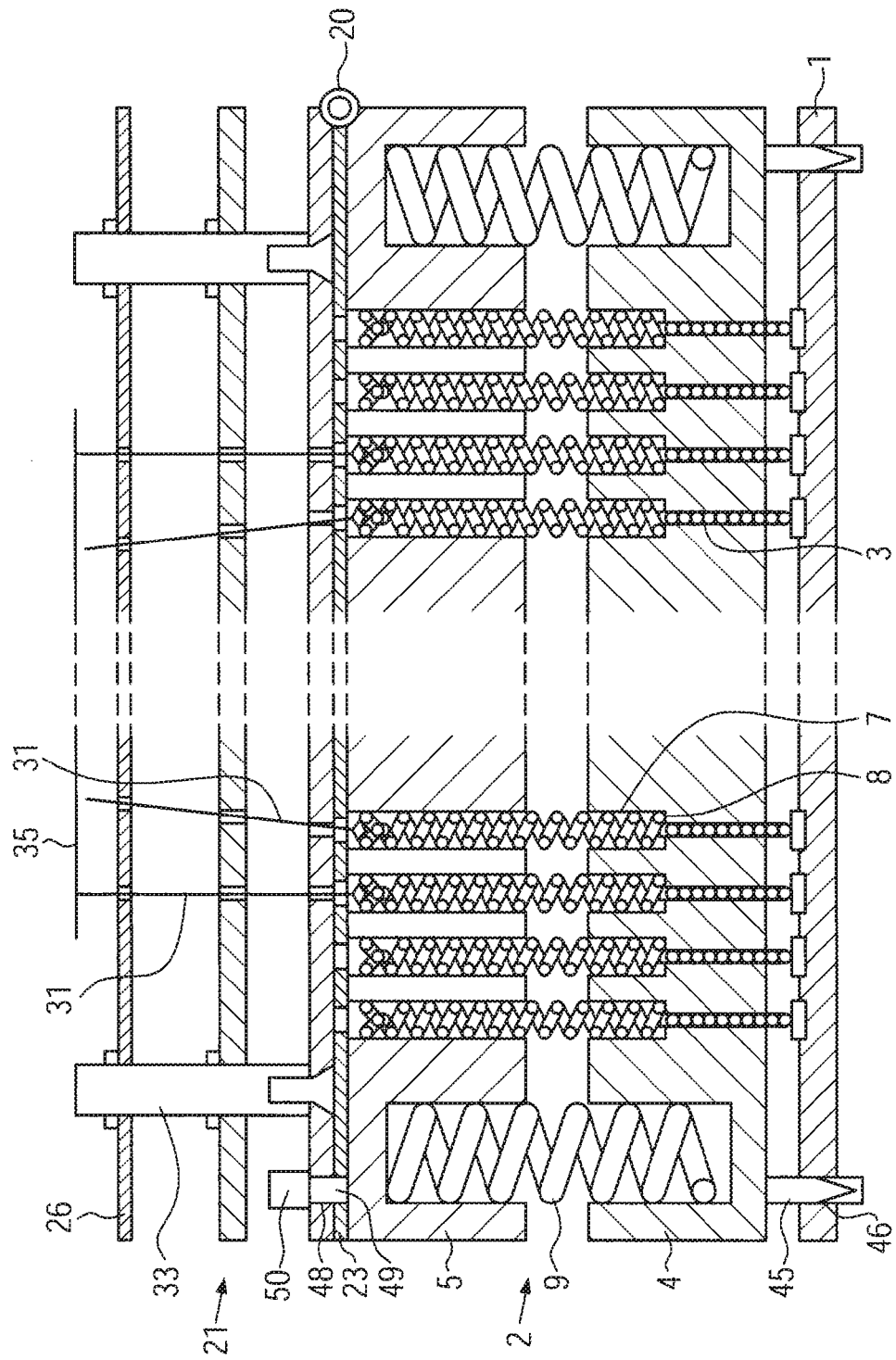

FIG. 4a is a highly diagrammatic and simplified representation of the contacting unit comprising the full grid cassette 2 and the adapter 21 in the folded-open state. FIG. 4b shows the contacting unit in the folded state. The full grid cassette 2 and the adapter 21 are fixed to each other by means of the locking device 49, 50. In this way, one of the test needles 31 is disposed on each of the spring contact pins 3, securing each other against falling out of the contacting unit. In the locked state, the contacting unit can therefore be handled with either side facing upwards without losing a test pin or a test needle. When the full grid cassette 2 and the adapter 21 are folded together, they are preferably guided such that the surfaces of the full grid cassette 2 and the adapter 21 which face each other are vertical at the moment of meeting, so that neither the spring contact pins 3 nor the contact needles 31 can fall out.

FIG. 4b shows the contacting unit mounted without load on the test apparatus. In this state, the basic grid plate 4 and the adapter plate 5 are pushed apart slightly by the guide device 9, and the spring contact pins 3 lie in the through holes 6, 7 in the released state. The basic grid plate 4 is fitted with several alignment pins 45 in engagement with alignment holes 46 of the basic grid element 1 of the test apparatus. The adapter plate 5 with the swivel joint 20 is securely connected to the BG unit 22 of the adapter, thereby aligning the full grid cassette 2 relative to the adapter 21. The thickened sections of the contact needles 31 are accommodated in the depressions of the trumpet sections 12 of the spring contact pins 3. The inclined contact needles 31 are arranged at a distance from the printed circuit board to be tested.

Figure 4C:
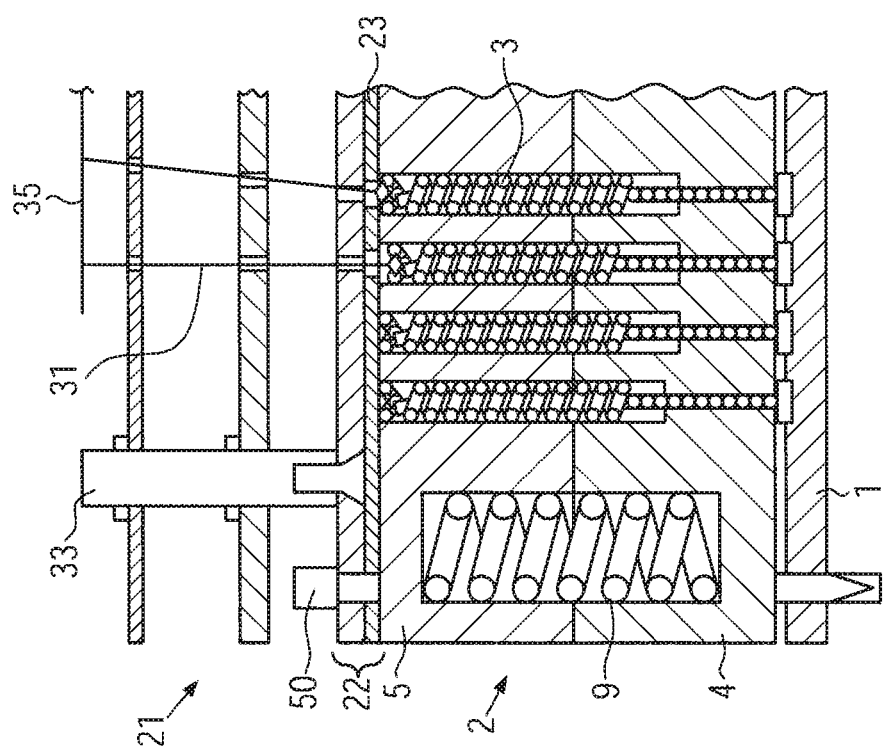

If this contact assembly is now loaded, i.e. compressed by a suitable press, the basic grid plate 4 and the adapter plate 5 are pushed together in the full grid cassette 2 against the spring action of the guide devices 9. This pushes the spring contact pins 3 towards the adapter 21. They are now spring-loaded against the contact needles 31. The contact needles 31 are then pushed towards the printed circuit board to be tested, so that all contact needles 31 contact the respective printed circuit board test points. FIG. 4c clearly illustrates the different levels of the contact points between contact needles and spring contact pins in inclined and non-inclined arrangements.

The spring contact pins 3 to which no contact needle 31 or contact pin 32 is assigned are pushed against the cover plate 23 of the adapter 21. In addition, the cover plate 23 covers the screw elements securing the column mechanisms 33 in the adapter. The cover plate 23 therefore ensures that there cannot be any unwanted contact between unused spring contact pins 3 and other elements of the adapter.

It should further be noted that the alignment pins 45 of the basic grid plate 4 and the alignment pins 47 of the adapter plate 5 are independent of one another, allowing the basic grid plate 4 and the adapter plate 5 to be independently aligned to the basic grid element 1 or the adapter 21 respectively. This independent alignment is further facilitated by the play between the basic grid plate 4 and the adapter plate 5. This play is on the one hand provided by the guide devices 9 and on the other hand by the fact that the spring contact pins 3 extend without a steel sleeve across the gap between the basic grid plate 4 and the adapter plate 5 and are therefore movable at right angles to their axial direction 10.

The invention has been described above with reference to an embodiment wherein the full grid cassette and the adapter are joined together by means of a joint. Within the scope of the invention, any type of releasable mechanical connection may be provided between the full grid cassette and the adapter. For example, a plurality of locking or latching devices may be provided on at least two opposing sides of the edge regions of the full grid cassette and the adapter, allowing the adapter to be completely released from the full grid cassette.

Within the scope of the invention, the spring contact pins may alternatively be secured against falling out of the full grid cassette by means of a film. The width of the holes in the film is less than the maximum diameter of the spring contact pins, so that the spring contact pins are located by the film in the axial direction. It is much easier to locate the spring contact pins in the full grid cassette than to locate the test needles in the adapter. In the assembled state of the full grid cassette and the adapter, the test needles of the adapter are secured against falling out by the spring contact pins of the full grid cassette.

The invention can be summarised briefly as follows:

The invention relates to a contacting unit for a test apparatus for testing printed circuit boards. The contacting unit comprises a full grid cassette and an adapter. The full grid cassette is provided with a plurality of spring contact pins arranged in a grid of contact points of a basic grid of a test apparatus. The adapter is provided with test needles for electrically connecting individual spring contact pins of the full grid cassette to individual circuit board test points of a printed circuit board to be tested, the spring contact pins in the full grid cassette being secured against falling out on the side remote from the adapter and the test needles in the adapter being secured against falling out on the side remote from the full grid cassette. The adapter and the full grid cassette are releasably joined to each other. As a result, both the spring contact pins and the test needles are secured against falling out in the assembled state of the adapter and the full grid cassette.

LIST OF REFERENCE NUMBERS

1 Basic grid element
2 Full grid cassette
3 Spring contact pin
4 Basic grid plate
5 Adapter plate
6 Through hole of adapter plate
7 Through hole of basic grid plate
8 Annular step
9 Guide device
10 Axial direction of the spring contact pins
11 Spring section
12 Trumpet section
13 Thickened section
14 Plug-in section
15 Central spring contact point
16 Contact pad of the basic grid
17 Circular line
18 Module
19 Abutting edge
20 Swivel joint
21 Adapter
22 BG unit
23 Cover plate
24 Structural plate
25 Retaining plate
26 Guide plate
27 PCB unit
28 Structural plate
219 Guide plate
30 Cover plate
31 Contact needle
32 Contact pin
33 Column mechanism
34 Alignment pin
35 Printed circuit board
36 Pad array
37 Plated-through hole
38 Thickening
39 Scanning head
40 Locking projection
41 Keyhole
42 Recess
43 Cross bar
44 Upright
45 Alignment pin
46 Alignment hole
47 Alignment pin
48 Alignment hole
49 Locking pin
50 Pin location
51 Notch

The invention claimed is:

1. Contacting unit for a test apparatus for testing printed circuit boards, comprising a full grid cassette and an adapter, wherein the full grid cassette has a plurality of spring contact pins located in a regular grid of contact points of a basic grid of the test apparatus and wherein the adapter has test needles provided for electrically connecting each one of the spring contact pins of the full grid cassette-to one of the circuit board test points of the printed circuit board to be tested, wherein a least a portion of the test needles are inclined within the adapter, wherein the spring contact pins in the full grid cassette are secured against falling out on a side remote from the adapter and the test needles in the adapter-are secured against falling out on a side remote from the full grid cassette, the adapter and the full grid cassette-being releasably connected to each other such that the adapter and the full grid cassette-form a rigidly joined contacting unit.

2. Contacting unit according to claim 1, wherein the releasable connection between the adapter and the full grid cassette-is provided by a latching and/or locking device.

3. Contacting unit according to claim 2, wherein the releasable connection between the adapter and the full grid cassette is provided by a swivel joint and a locking device, wherein the swivel joint is located at the edge of the facing surfaces of the adapter and the full grid cassette, so that the contacting unit comprising the adapter and the full grid cassette can be folded open and the full grid cassette and the adapter can be locked by means of the locking device in the folded.

4. Contacting unit according to claim 3, wherein the swivel joint is releasable.

5. Contacting unit according to claim 4, wherein the adapter and the full grid cassette can be connected to each other by means of a releasable latching or locking mechanism.

6. Contacting unit according to claim 5, wherein the spring contact pins are made from a wire with a helically wound spring section and located without sheathing in the full grid cassette.

7. Contacting unit according to claim 6, wherein the each of the spring contact pins is helically wound from a wire and the maximum diameter of each spring contact pin does not exceed 0.8 mm, and in that, at the end of the spring contact pins which faces the basic grid, the end winding of the wire is wound to a smaller radius than adjacent windings, so that the wire has an end located centrally with respect to adjacent windings and forming a central contact point.

8. Contacting unit according to claim 7, wherein each of the spring contact pins has a trumpet section at the end pointing towards the adapter.

9. Contacting unit according to claim 8, wherein the test needles of the adapter are substantially straight without any helical windings and have a thickened section provided to secure the test needles against falling out on the side of the adapter which faces the printed circuit board to be tested.

10. Contacting unit according to claim 9, wherein the full grid cassette is made up from an adapter plate facing the adapter and a basic grid plate facing the basic grid, and in that a guide device between the adapter plate and the basic grid plate is designed such that the adapter plate and the basic grid plate are movable relative to each other in the axial direction of the spring contact pins and have a play in the plane extending at right angles to the axial direction of the spring contact pins.

11. Contacting unit according to claim 10, wherein the test needles of the adapter include contact needles and/or contact pins.

12. Contacting unit according to claim 11, wherein the spring contact pins are secured in the full grid cassette by means of a film against falling out, the film having holes with a width which is less than the maximum diameter of the spring contact pins.

13. Contacting unit according to claim 12, wherein the spring contact pins have a plug-in section formed at the end of the spring contact pins which faces the basic grid and having a smaller diameter than the section of the spring contact pins which extends from the plug-in section towards the adapter, so that there is a tapering point, through holes being provided in the full grid cassette for the accommodation of individual plug-in sections, the through holes having an annular step serving as a stop for the tapering point of the spring contact pins.

14. Contacting unit according to claim 1, wherein the releasable connection between the adapter and the full grid cassette is provided by a swivel joint and a locking device, wherein the swivel joint is located at the edge of the facing surfaces of the adapter and the full grid cassette, so that the contacting unit comprising the adapter and the full grid cassette can be folded open and the full grid cassette and the adapter can be locked by means of the locking device in the folded state.

15. Contacting unit according to claim 14, wherein the swivel joint is releasable.

16. Contacting unit according to claim 1, wherein the adapter and the full grid cassette can be connected to each other by means of a releasable latching or locking mechanism.

17. Contacting unit according to claim 1, wherein the spring contact pins are made from a wire with a helically wound spring section and located without sheathing in the full grid cassette.

18. Contacting unit according to claim 17, wherein the each of the spring contact pins is helically wound from a wire and the maximum diameter of each spring contact pin does not exceed 0.8 mm, and in that, at the end of the spring contact pins which faces the basic grid, the end winding of the wire is wound to a smaller radius than adjacent windings, so that the wire has an end located centrally with respect to adjacent windings and forming a central contact point.

19. Contacting unit according to claim 17, wherein each of the spring contact pins has a trumpet section at the end pointing towards the adapter.

20. Contacting unit according to claim 1, wherein the test needles of the adapter are substantially straight without any helical windings and have a thickened section provided to secure the test needles against falling out on the side of the adapter which faces the printed circuit board to be tested.

21. Contacting unit according to claim 1, wherein the full grid cassette is made up from an adapter plate facing the adapter and a basic grid plate facing the basic grid, and in that a guide device between the adapter plate and the basic grid plate is designed such that the adapter plate and the basic grid plate are movable relative to each other in the axial direction of the spring contact pins and have a play in the plane extending at right angles to the axial direction of the spring contact pins.

22. Contacting unit according to claim 1, wherein the test needles of the adapter include contact needles and/or contact pins.

23. Contacting unit according to claim 1, wherein the spring contact pins are secured in the full grid cassette by means of a film against falling out, the film having holes with a width which is less than the maximum diameter of the spring contact pins.

24. Contacting unit according to claim 1, wherein the spring contact pins have a plug-in section formed at the end of the spring contact pins which faces the basic grid and having a smaller diameter than the section of the spring contact pins which extends from the plug-in section towards the adapter, so that there is a tapering point, through holes being provided in the full grid cassette for the accommodation of individual plug-in sections, the through holes having an annular step serving as a stop for the tapering point of the spring contact pins.

* * * * *